(12) United States Patent
Jovenin

(10) Patent No.: US 6,597,250 B2
(45) Date of Patent: Jul. 22, 2003

(54) LOW-NOISE AND RAPID RESPONSE FREQUENCY SYNTHESIZER, AND CORRESPONDING FREQUENCY SYNTHESIZING METHOD

(75) Inventor: Fabrice Jovenin, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/965,413

(22) Filed: Sep. 27, 2001

(65) Prior Publication Data

US 2002/0118074 A1 Aug. 29, 2002

(30) Foreign Application Priority Data

Sep. 29, 2000 (FR) .............................. 00 12459
Dec. 26, 2000 (FR) .............................. 00 17041

(51) Int. Cl.[7] ................................................ H03B 1/00
(52) U.S. Cl. .................... 331/177 V; 331/14; 331/16
(58) Field of Search ................. 331/177 V, 10, 331/14, 16, 1 A, 25, 11

(56) References Cited

U.S. PATENT DOCUMENTS

| | | | | |
|---|---|---|---|---|
| 4,024,464 A | * | 5/1977 | Underhill et al. | 331/10 |
| 4,205,272 A | * | 5/1980 | Kumagai | 455/83 |
| 4,320,357 A | * | 3/1982 | Wulfsberg et al. | 331/16 |
| 4,344,187 A | * | 8/1982 | Ogita et al. | 455/182 |
| 4,360,788 A | * | 11/1982 | Erps et al. | 331/1 A |
| 4,667,169 A | * | 5/1987 | Matsuura et al. | 331/14 |
| 5,053,723 A | * | 10/1991 | Schemmel | 331/14 |
| 5,648,744 A | | 7/1997 | Prakash et al. | 331/11 |

FOREIGN PATENT DOCUMENTS

| | | | |
|---|---|---|---|
| EP | 0563400 A1 | 10/1992 | H03L/7/18 |
| EP | 0661816 B1 | 12/1994 | H03L/7/187 |
| EP | 0664616 A3 | 1/1995 | H03L/7/10 |
| EP | 0910170 A2 | 10/1998 | H03L/7/099 |
| EP | 0944171 A1 | 3/1999 | H03L/7/099 |
| WO | WO8906456 | 12/1988 | H03L/19/00 |

* cited by examiner

Primary Examiner—Brian Young
Assistant Examiner—John B Nguyen
(74) Attorney, Agent, or Firm—Steven R. Biren

(57) ABSTRACT

A frequency synthesizer comprising a phase-locked loop that includes a phase-frequency comparator (16), at least a voltage-controlled oscillator (12) associated with a selection apparatus (50, 80, 82) of an oscillation frequency band, and a frequency divider (14) connected between the oscillator and the comparator. A voltage source proper (90) is connected to the selection apparatus for supplying it with a control voltage proper.

19 Claims, 4 Drawing Sheets

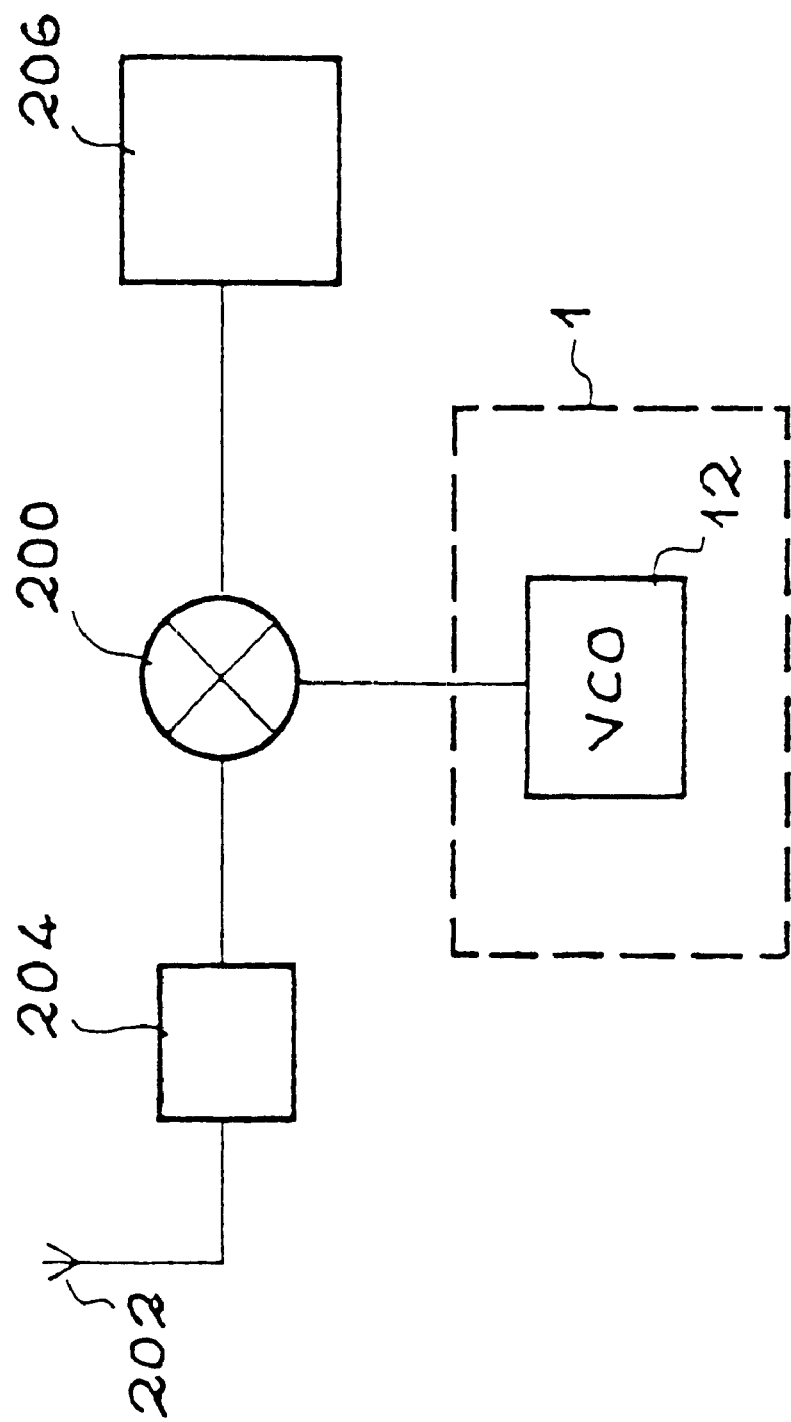

LOW-NOISE AND RAPID RESPONSE FREQUENCY SYNTHESIZER, AND CORRESPONDING FREQUENCY SYNTHESIZING METHOD

BACKGROUND OF THE INVENTION

Field of the Invention

The present invent ion relates to a frequency synthesizer having a fractional divider and a corresponding frequency synthesizing method.

The invention more particularly relates to a low-noise frequency synthesizer permitting a precise adjustment of the frequency and capable of rapidly switching between various selected frequencies one after the other.

Such a frequency synthesizer may be used in various types of radio circuits and, more particularly, in receiving and/or transmitting stages of these circuits. By way of example the frequency synthesizer according to the invention may be used in cordless telephony equipment such as portable telephones.

BACKGROUND OF THE INVENTION

Figure 1:
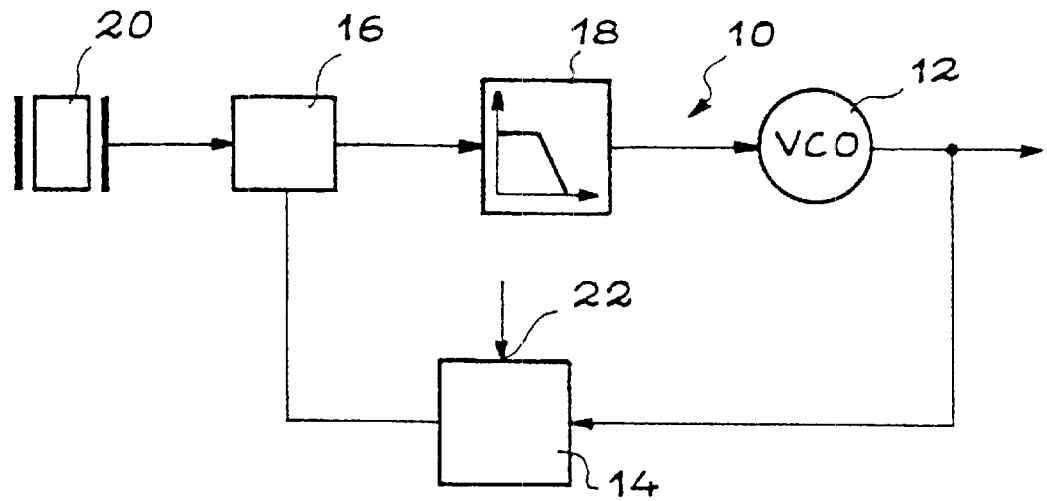
Figure 2:
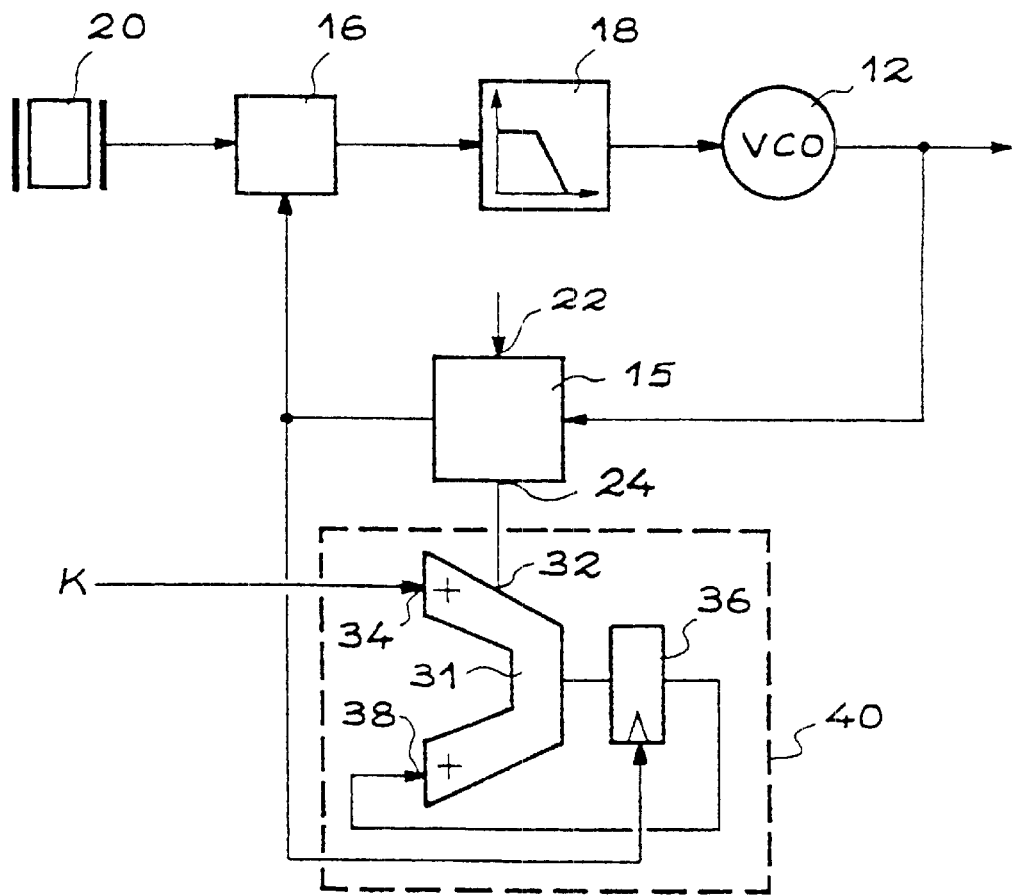

The appended FIGS. 1 and 2 illustrate an integral-value adjustable frequency synthesizer and a fractional-value adjustable frequency synthesizer. A fractional-value adjustable frequency synthesizer is understood to be a frequency synthesizer whose frequency can be adjusted by integral or non-integral multiples of a reference frequency. Such devices are known per se and illustrated, for example, by the documents (1), (2) and (3), whose complete references are stated at the end of the description.

FIG. 1 indicates the basic structure of a frequency synthesizer, which is constructed around a phase-locked loop 10. The phase-locked loop comprises, in essence, a voltage-controlled oscillator 12, a frequency divider 14, a phase-frequency comparator 16 and a loop filter 18.

The voltage-controlled oscillator 12, also referred to as a <<VCO oscillator>> in the following text, delivers an output signal whose frequency can be increased or reduced as a function of a control voltage applied to its input. This control voltage is produced by the phase-frequency comparator 16, which is connected to the input of the VCO oscillator 12 via the loop filter 18.

The phase-frequency comparator 16 compares the frequency (or phase) of a signal delivered by the frequency divider 14 and the frequency of a reference signal delivered in the example of the Figure by a quartz device 20. When the frequency of the signal delivered by the frequency divider is lower than that of the reference signal, the phase-frequency comparator associated to the loop filter 18 produces a voltage instructing the frequency of the VCO oscillator 12 to be increased. Conversely, the frequency of the VCO oscillator is reduced when the frequency of the signal delivered by the frequency divider is higher than that of the reference signal.

The frequency divider 14 is a device constructed around a certain number of flip-flops and can thus divide the frequency of the signal of the VCO oscillator 12 only by integral values. The dividing ratio, which is adjustable by integral values, is an integer referred to as N. An adjusting input, indicated by an arrow 22, enables to fix the value N.

The frequency of the VCO oscillator, referred to as $F_{VCO}$ is thus such that:

$$F_{VCO} = N * F_{ref} \quad (1)$$

where $F_{REF}$ is the frequency of the reference signal delivered by the quartz device 20.

It is observed that a modification by unity of the value of the dividing ratio N (integral) provokes a variation equal to Fref of the frequency of the VCO oscillator. Accordingly, it is impossible to adjust the frequency of the VCO oscillator 12 with a resolution higher than Fref. In the case where the frequency of the reference signal is high, this resolution may turn out to be insufficient.

A much finer adjustment of the frequency of the output signal of the loop 10, that is to say, of the frequency of the signal delivered by the VCO oscillator 12, may be obtained with a frequency synthesizer in accordance with FIG. 2.

The frequency synthesizer shown in FIG. 2 comprises a phase-locked loop 10 which includes the same elements as those of loop 10 of FIG. 1.

The frequency divider 14, on the other hand, has not only an adjusting input 22 for fixing the value N of the dividing ratio, but also a switch input 24 for switching the dividing ratio between two or more consecutive values around the value N. In the example of FIG. 2, the switch input 24 of the frequency divider 14 enables to switch the dividing ratio between two values, which are N and N+1.

The switch input 24 is connected to a sigma-delta modulator 40 and, to be more precise, to an overflow-carry terminal 32 of this modulator.

The sigma-delta modulator 30 which, in the example of the Figure, is a first-order digital modulator with a word adder 31, has a first digital input 34 for an adjusting instruction referred to as K. The adjusting instruction is added to a digital value delivered by a shift register 36 of the modulator. The register 36 is clocked by the output signal of the frequency divider 14, and receives the output of the word adder 31. It is connected to a second digital input 38 of the adder. When the sum of the adjusting instruction and of the output of the register 36 is lower than a digital capacity of the adder 31, the overflow-carry adopts the logic 0 value, for example. On the other hand, when the sum is higher than the capacity of the adder 31, the overflow-carry adopts the complementary logic 1 value in that case.

The frequency divider 14 is arranged for performing a frequency division with a first dividing ratio when its switch input 24 receives the first logic state and for performing a division with a second dividing ratio which is different from +/−1, when the input 24 receives the second switching state.

In the example described, the dividing ratio is N for a logic 0 state and N+1 for a logic 1 state.

Although at any instant the dividing ratio of the frequency divider is an integer, the repeated switching of the ratio between N and N+1 enables to obtain a resulting mean dividing ratio comprised between these two values, that is to say, a non-integral ratio.

In a more precise way, one has:

$$F_{VCO} = \frac{1}{T_N + T_{N+1}} [T_N * N * F_{ref} + T_{N+1} * (N+1) * F_{ref}]$$

that is, $$F_{VCO} = \left[ N + \frac{T_{N+1}}{T_N + T_{N+1}} \right] * F_{ref}$$

In these expressions, $T_N$ and $T_{N+1}$ are the periods during which the dividing ratio is equal to N and N+1, respectively.

Considering that the adjusting instruction K applied to the first input 34 of the sigma-delta modulator is coded in L bits, and that the maximum capacity of the adder is $2^L-1$, a fractional part of the dividing ratio equal to $K/2^L$ can be defined. The fractional component $K/2^L$ is further denoted k in the following of the text. One has:

$$Fvco = \left[N + \frac{K}{2^L}\right] * F_{ref} \quad (2)$$

For low values of the adjusting instruction (K=0) the output frequency is close to $F_{ref}*(N)$ and for high values of the adjusting instruction (K=$2^L$) the output frequency is close to $F_{ref}*(N+1)$.

Accordingly, it is possible to continuously adjust the frequency of the phase-locked loop between two values fixed by the choice of the dividing ratio N applied to the adjusting input 22 of the frequency divider 14 and by the choice of the adjusting instruction K applied to the sigma-delta modulator.

In the conventional phase-locked loops shown in FIG. 1, the oscillation frequency of the voltage-controlled oscillator may be adjusted via frequency "steps" whose value is $F_{ref}$. The "step" thus corresponds to a variation of the dividing ratio from N to N+1 or from N to N−1. This clearly appears when reference is made to formula (1) indicated previously.

In order to obtain a relatively precise adjustment of the frequency of the loop, for example, the value of the frequency Fref of the reference signal is preferably chosen to be low. By way of a simple example, the frequency $F_{ref}$, and thus the adjusting step, may be of the order of 200 kHz.

It may also be observed that a low reference frequency leads to retaining high values N of the dividing ratio. Indeed, it would be recollected that the frequency of the voltage-controlled oscillator is the product of the reference frequency (relatively low) and the dividing ratio N (relatively high).

The constraint of the choice of a relatively low value for the reference frequency does not exist, however, in a phase-locked loop as shown in FIG. 2.

The formula (2) given earlier actually shows that it is possible to adjust the frequency by making the value of the fractional part k vary, that is to say $K/2^L$. The adjusting step may thus be that $F_{ref}/2^L$. For an 8 or 16-bit coding, that is to say, for L=8 or L=16, for example, the adjustment may be made nearly continuously and in a manner substantially independent of the reference frequency.

Thus, for phase-locked loops with a fractional divider, the reference frequency is preferably chosen to be very high. It is, for example, of the order of 26 MHz. A high frequency actually permits to correct the drifts of the loop in a finer way and thus permits a larger stability.

It may further be observed that the choice of a relatively high reference frequency permits to retain low values of N, that is to say, low values of the integral part of the dividing ratio.

The pulsation of its own of the phase-locked loop, denoted $\omega_n$, may be expressed as a function of the gain $K_{VCO}$ of the voltage-controlled oscillator 12, of the gain $K_\phi$ of a charge pump of the phase-frequency comparator 16, of the capacitance C of a capacitor of the loop filter 18 and of the integral part N of the dividing ratio of the divider 22. The relationship is the following:

$$\omega_n = \sqrt{\frac{K_{VCO} \cdot K_\phi}{N \cdot C}} \quad (3)$$

Also the switch time $t_s$ of the phase-locked loop depends on the value $\omega_n$ of the pulsation of the loop. The switch time $t_s$ may be understood to be the time necessary for the loop to be set at a given pulsation oscillation system or the time necessary for switching from one pulsation or frequency value to another.

The switch time $t_s$ is linked with the pulsation via the following relationship:

$$t_s = (2.5 \times 2 \times \pi)/\omega_n$$

By referring also to formula (3) of the pulsation $\omega_n$ indicated above, it is found that with an equal pulsation, relatively low values of the dividing ratio N, or at least all of its integral part, are to be compensated for by relatively high values of the capacitance C of the loop filter. Indeed, the values $K_{VCO}$ and $K_\phi$ are constant factors linked with the oscillator and with the charge pump of the phase-frequency comparator.

The choice of a high-value capacitor for the loop filter makes the influence of another time parameter t evident, which is the charge time of this capacitor. The loop filter may be considered a passband filter with a capacitor capable of converting a current i, not frequency filtered, of the charge pump of the phase frequency converter and a voltage $V_{tune}$, frequency filtered, and used for controlling the VCO oscillator. The charge time t of the capacitor C is linked with the current i and with the voltage $V_{tune}$ via the following relationship:

$$t = C \times V_{tune}/i \quad (4)$$

In this expression, C is the capacitance of the loop filter.

The charge time t of the capacitor will be added to the switch time $t_s$ previously mentioned and is likely to be unfavorable for the tuning speed of the loop at a desired frequency. This problem is specific to the loops which comprise a fractional divider, that is to say, loops controlled via a high reference frequency and having a low dividing ratio N.

The state of the art is further illustrated via documents whose references are stated at the end of the description.

SUMMARY OF THE INVENTION

It is an object of the invention to propose a frequency synthesizer and a corresponding method of frequency synthesis, which do not have the limitations mentioned above.

It is more particularly an object of the invention to propose a frequency synthesizer of the type having a fractional divider, capable of operation with a high reference frequency and having a very brief overall switch time.

It is another object of the invention to propose such a synthesizer in which it is not necessary to resort to a multiplication of the number of charge pumps or to the overdimensioning of the charge pump providing the phase frequency converter with a phase-locked loop.

It is a further object of the invention to propose such a synthesizer which is to a large extent freed from the dispersion of characteristic features of the components and of the influence of thermal drifts.

Finally, it is an object of the invention to provide a low-noise frequency synthesizer which has a particularly reduced phase noise.

To achieve these objects mentioned above the invention proposes to equip the phase-locked loop with a voltage-controlled oscillator associated to oscillation frequency band selection means. While the frequency synthesizer has the disposal of various oscillation frequency bands, also called "passbands", these bands may be narrower than the overall frequency band that is likely to be generated by the frequency synthesizer. While keeping the control voltage $V_{tune}$ unchanged for narrower frequency bands, it is possible to reduce the gain $K_{VCO}$ of the voltage-controlled oscillator in these frequency bands. The gain $K_{VCO}$ of a voltage-controlled oscillator is, in effect, comprised as the ratio of the frequency related to that of the control voltage.

While reference is made to equation (3) of the pulsation of the phase-locked loop given in the introductory part of the text, it is found that a reduction of the gain $K_{VCO}$ permits with an equal pulsing value, a reduction of the value of the capacitance C of the loop filter. A capacitance C that is lower permits to reduce the charge time t. For this subject one may be referred to equation (4) also given in the introductory part.

While reference is still made to this same formula, one could have observed that an increase of the current i would also have led to a reduction of the charge time t. On the other hand, this other solution, not retained by the invention, would have required a new concept of the charge pump of the phase frequency comparator to augment the intensity of the current i which it delivers.

The selection of the oscillation frequency bands resorts to a control voltage, so that the selection can be made automatically. The control voltage may be used for selecting a capacitance or an oscillator stage. This aspect is described in the following of the text. The invention notably proposes to equip the frequency synthesizer with a voltage source of its own, that is to say, a source that does not cause any noise, and to apply this voltage to the selection means as a control voltage.

Thus, the invention more particularly relates to a frequency synthesizer comprising in a phase-locked loop:
 a phase-frequency comparator,
  at least a voltage-controlled oscillator associated to selection means for selecting an oscillation frequency band, and
  a frequency divider connected between the oscillator and the comparator,
and further comprising a voltage source of its own connected to the selection means for supplying a control voltage of its own to the selection means.

The use of a voltage of its own has a particular interest here, because it permits to omit the phase noise synthesizer. The influence of phase noise would, in effect, be unwanted in a number of applications linked with the transmission of signals by radio channel.

The selection means for selecting a passband may be realized in various ways. By way of example, these means may comprise switches which permit to select various stages of a voltage-controlled oscillator of which each stage forms an autonomous VCO oscillator with its own passband and its own center frequency. According to another possibility, the selection means may comprise a bank of capacitors which may be switched to be associated to a single VCO in order to modify thereof the center frequency and the passband.

The capacitances may be formed by capacitors or by varactors. They form in this case with the single VCO oscillator, oscillator stages which can be compared to a plurality of independent oscillators. The varactors (voltage-variable capacitors) are capacitors whose capacitance value is adjustable via a control voltage. The capacitance value of the varactors evolves continuously as a function of a voltage applied thereto and which may vary, for example, between 0 and 4 volts. It is also possible to use the varactors for switchings between two voltage values, and, as the case may be, for binary switches. In that case, they are supplied either with a first non-zero control voltage (for example 4 volts), or a second, preferably zero (0 volts), voltage. The varactor is then related to a switch connected in series to a fixed-value capacitor. The varactors may comprise various autonomous stages which operate each as a capacitor whose capacitance is adjustable via a control voltage. In the latter-case the synthesizer may comprise a multiplexer for distributing the control voltage to the varactor stages.

One problem of the control is linked to the supply of a control voltage of its own. The supply voltage is indeed likely to be affected by noise, which is detrimental to the stability of selection of the oscillator stages. This difficulty may be overcome, in accordance with the invention, by equipping the synthesizer with a capacitor that serves as a voltage source and with transitional charge means for the capacitor.

Transitional charge means are understood to be the capacitor of the charge means which are only active during a transitional period, preferably very briefly, and preferably started when the frequency synthesizer is put into operation.

As the selection means need to have only a control voltage and no supply voltage, substantially no current is tapped from the capacitor. Thus, during the transition period, the capacitor can no longer be subjected to any trickle charge. It is thus autonomous and freed from the noise of the power supply of the synthesizer and constitutes a voltage source of its own.

In particular applications of the invention, the general supply voltage of the frequency synthesizer may be lower than the control voltage required by the selection means of an oscillation frequency band. By way of example, the general supply voltage (regulated) may be of the order of 2 volts (1.8 volts), whereas the control voltage required for the varactors is of the order of 4 volts (3.5 volts). In such case the invention proposes to equip the transitional charge means with a non-regenerated voltage doubler. The non-regenerated voltage doubler also has a transitional function during which it effects a shift of the reference potential of a capacitor. The shift switching, a serious noise generator, takes place only one time and for a very brief period, each time the frequency synthesizer has been put into operation.

The invention also relates to a method of frequency synthesis by means of a synthesizer as described. The method thus comprises a transitional phase of establishing the own voltage, followed by at least a phase of frequency synthesis.

Other characteristic features and advantages of the invention pertain to the description that will follow, and have reference to the appended drawing Figures. This description is given in a purely illustrative and non-limitative capacity.

BRIEF DESCRIPTION OF THE DRAWING FIGURES

Figure 3:
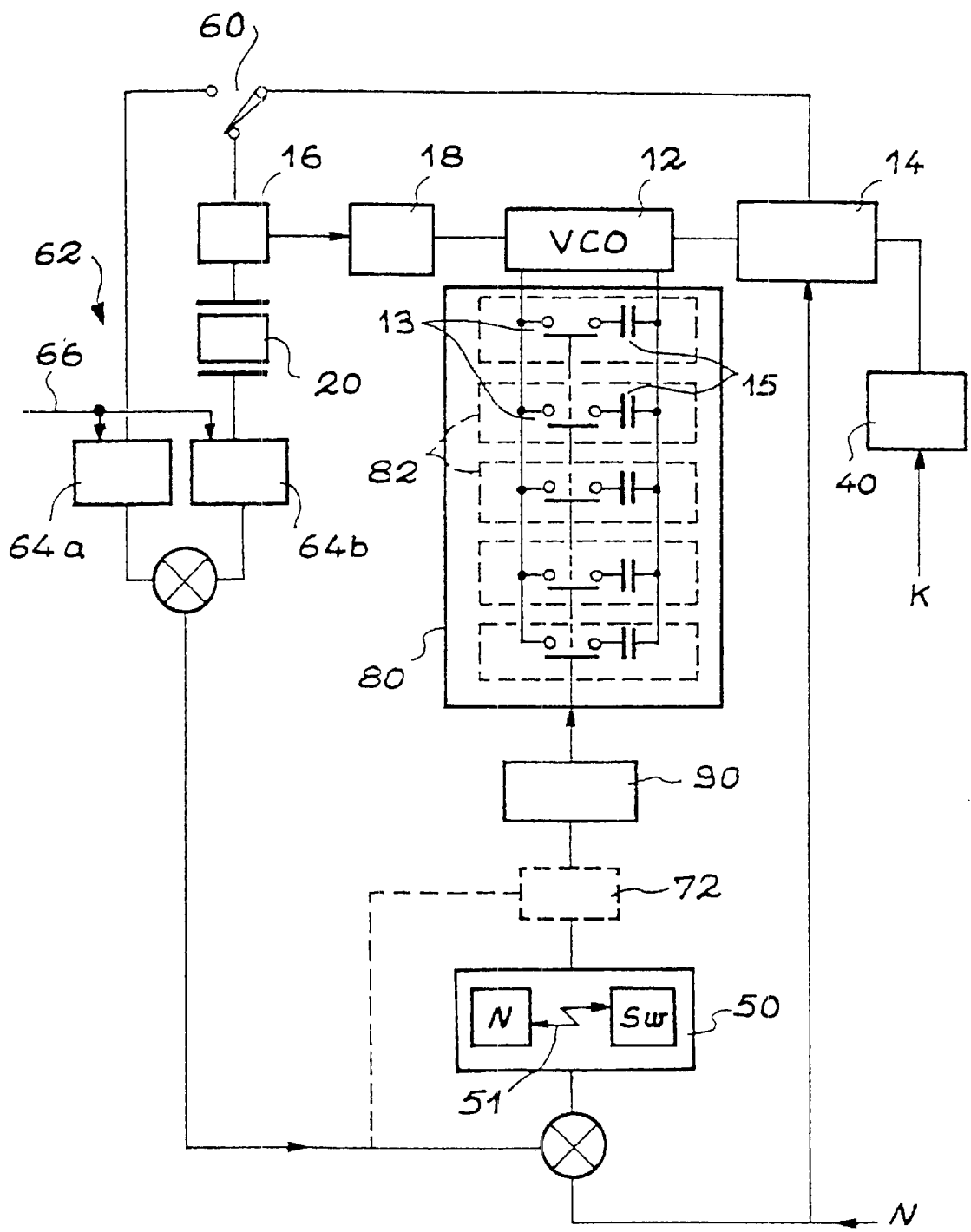
Figure 4:
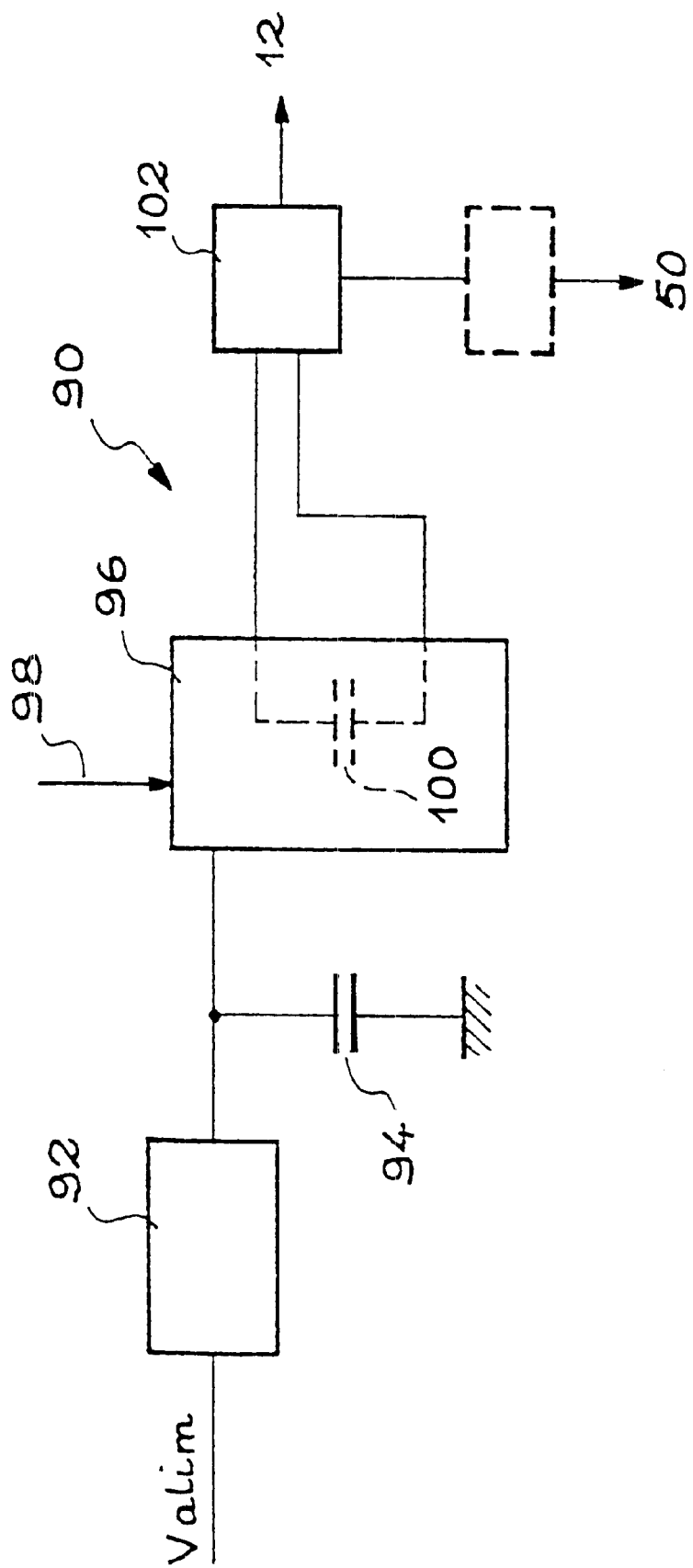

FIG. 1 already described, is a simplified basic circuit diagram of a known frequency synthesizer which has discrete frequency adjustment, FIG. 2, already described, is a simplified basic circuit diagram of a known frequency synthesizer which has continuous frequency adjustment, FIG. 3 is a simplified diagram of a frequency synthesizer according to the invention, FIG. 4 is a diagrammatic representation of a voltage source of its own used in the device shown in FIG. 3, FIG. 5 is a simplified diagrammatic representation of a frequency converter utilizing a frequency synthesizer according to with the invention.

DETAILED DESCRIPTION OF EMBODIMENTS OF THE INVENTION

In the following description, parts of FIGS. 3 and 4 which are identical, similar or equivalent to parts already described with reference to the FIGS. 1 and 2 have the same digital reference labels. One may thus, with respect thereto, refer to the preceding description.

signal of the frequency-controlled oscillator for minimum and maximum values of the voltage $V_{tune}$. The frequencies are expressed in megahertz. Each bit of the command instructions corresponds, for example, to the activation of one varactor line. It may be observed with respect to this that the Table I does not exactly correspond to FIG. 3 which, for clarity, represents only five varactor lines, whereas the Table distinguishes seven different instructions.

TABLE I

| N | ≦8 | 9 à 14 | 11 à 17 | 14 à 20 | 18 à 23 | 21 à 27 | ≧28 |
|---|---|---|---|---|---|---|---|
| instruction | "0000,00" | "0000,01" | "0001,01" | "0011,01" | "0111,01" | "1111,01" | "1111,11" |
| freq@0.4 V | 1.757 | 1.787 | 1.817 | 1.858 | 1.893 | 1.939 | |
| Freq@3.8 V | | 1.842 | 1.876 | 1.921 | 1.960 | 2.012 | 2.069 |

The sole oscillator of FIGS. 1 and 2 is replaced in FIG. 3 by an oscillator 12 associated to a varactor 80. The varactor 80 comprises various stages 82, also called "lines", which have each an adjustable capacitor via a control voltage.

The various varactor lines 82 are connected in parallel to a voltage-controlled oscillator 12. A distinction should here be made between the control voltage of the oscillator supplied by a phase-frequency comparator 16 associated to the loop filter 18 and a control voltage of the varactor lines supplied by a voltage source 90 to be described hereinafter.

The varactor lines 82 are used for applying various capacitances to the VCO oscillator 12. This permits to tune the oscillator to various oscillation center frequencies and to select various oscillation frequency bands. The oscillation frequencies are the frequency ranges of the signal which are produced by the voltage-controlled oscillator when the control voltage varies by a minimum voltage, of the order of 0 volts, up to a maximum voltage of the order of 4 volts. The center frequency is defined as the frequency of the oscillator signal when a mean control voltage is applied thereto.

The possibility could be contemplated a priori to simply select the oscillation frequency bands by varying the control voltage of the capacitor of a single varactor line. It is, however, very difficult to design a variable voltage source that does not cause any noise.

Because of this difficulty it is preferred to retain a varactor 80 with a plurality of independent lines in which each line is controlled between two capacitance values in an on/off-mode. As shown in FIG. 3, each varactor line 82 is symbolically represented by a capacitor 15 which is connected in series with a switch 13 intended to connect or not the capacitor to the VCO oscillator.

The control of the switches implies, on the one hand, a logic table 50 and, on the other hand, the control voltage source 90 to be described hereinafter.

As indicated in the introductory part, the two control parameters which are essential to the frequency synthesizer are the integral part N of the dividing ratio and the fractional part which is controlled by an adjusting instruction K applied to the sigma-delta modulator 40.

The value N is directly applied to the frequency divider 14, but also to a logic table 50. A pointer 51 of the logic table permits to select a digital command instruction of the varactor lines 82 as a function of the value N.

The Table I below gives an example of correspondence between the values N, a logic control instruction of the varactor lines and of the frequency ranges of the response Furthermore, the Table I does not exactly match the contents of the logic table 50. Indeed, certain values of N may correspond to various combinations of capacitors of the varactor lines. This corresponds to overlaps of the frequency ranges which may be generated by the selection of various frequency bands for the oscillator.

When two combinations of capacitors of the varactor lines can correspond to a same value N, the table of correspondence may be programmed, for example, to retain the previously selected combination or the combination corresponding to a center frequency which is closest to the desired oscillation frequency.

The table of correspondence may comprise a memory ROM (read-only memory), programmed during manufacture or, possibly, a programmable memory of the EPROM type.

In normal operation of the frequency synthesis, the output of the frequency divider is connected to the input of the phase-frequency comparator 16. However, a switch 60 permits to send the frequency-divided signal to a calibration stage 62 when the switch 60 is being turned on or even each time the value N of the integral part of the dividing ratio is being modified.

The calibration stage comprises two substantially identical counters 64a and 64b. The first counter 64a is connected, via the switch 60, to the output of the frequency divider 14. The second counter 64b, on the other hand, is directly connected to the quartz crystal of the reference frequency source 20. A synchronization command 66 permits to simultaneously start and end the counting of the two counters 64a and 64b.

In principle, when the oscillation stages are calibrated perfectly well and when they oscillate at the frequency selected by the choice of N, no difference should exist between the result of the count of the two counters. Indeed, if $F_{VCO}$, the oscillation frequency of the selected oscillator stage, is such that $F_{VCO}=F_{ref}*N$, one would have to obtain on the output of the divider, that is to say on the input of the first counter, a frequency $F_{VCO}/N$ or $F_{ref}$, which is the frequency of the reference frequency source. It should be considered here that during a calibration phase a fractional component k is kept zero.

On the other hand, if there is a counting difference between the two counters, a correction can be made. A difference Mb−Ma is established by a subtracter 68, connected to the outputs of the two counters 64a and 64b. Ma and Mb indicate here the counting values of the two counters obtained during a counting period Δt separating the commands of synchronization of the start and the end of the counting.

In the example described the minimum error between the sum obtained via the two counters is 1, which corresponds to a frequency error of one time the value of the reference frequency $F_{ref}$. In other words, one has:

$$F_{VCO}=(N+\Delta N)*F_{ref}$$

where $\Delta N$ is the frequency error of the oscillator related to a variation of the dividing ratio. One may also write:

$$Min|Mb-Ma|=\Delta t * F ref/N*Min(\Delta N).$$

In this expression Min indicates the minimum.

The value of Min($\Delta N$), which is not necessarily an integer, may preferably be chosen as a function of the importance of the overlap between the frequency ranges and thus the ranges of dividing ratios associated to the various oscillator stages. On the choice of $\Delta N$ also depends the choice of $\Delta t$.

In the example described here $\Delta N$ is chosen to be 1 and thus $\Delta t=F_{ref}/N$ (with Min|Mb−Ma|=1).

The time $\Delta t$ is short compared to the times t and $t_s$ indicated previously. By way of simple example one may have $\Delta t=20$ µsec for $t_s=100$ µsec and t=1000 µsec.

The subtracter 68 is connected to an adder 70 provided at the input of the logic table 50 to add to the value N the difference Mb−Ma. This permits to take the counting error into account for the selection of the oscillator stage. It should be observed that the value N applied to the divider 14 is kept unchanged.

According to another possibility, represented in a broken line, the correction linked with the counting difference may also be taken into account as an alternative at the output of the table 50. In that case, however, the counting difference is to be translated into a modification of the logic command instructions ($S_w$) of the switches. This operation is executed via a register 72.

At the end of the calibration phase a new switching of the switch 60 permits to close the loop again until a new value of N or a value N likely to modify the choice of the oscillator stage VCO is selected.

FIG. 4 shows in a more precise manner the realization of the control voltage source 90. It is connected between the logic table 50, or the register 72, and the varactor 80. The control voltage source comprises a low-noise regulator 92 which connects a capacitor 94 called external capacitor, to a supply voltage terminal $V_{alim}$. The regulator delivers, for example, a regulated DC voltage of 1.8 volts while being supplied with a supply voltage $V_{alim}$ of 2.7 volts.

The external capacitor 94 is connected to a non-regenerated voltage doubler 96. The latter has a synchronization command 98 and comprises an internal capacitor 100. The internal capacitor is charged in a time interval between a first and a second synchronization pulse which come after the frequency synthesizer has been switched on. These pulses, delivered at the synchronization command 98 follow the switch-on, for example, with time intervals of 2.5 and 5 µsec. In these periods of time the internal capacitor is charged by the external capacitor until also the same charging voltage of 1.8 volts, for example, has been reached.

The internal capacitor 100 is charged between a potential realized by the external capacitor and a reference potential which is, for example, ground potential. During the second synchronization pulse, the charging is interrupted and the reference potential of the internal capacitor is brought to the potential of the external capacitor. When considering that the capacitance of the external capacitor is sufficiently higher than that of the internal capacitor to be able to neglect its discharging, the shift of the reference potential is equivalent to doubling the available voltage.

The switching, which corresponds to the doubling of the voltage, is a considerable noise generator, but operates only once, when it is switched on. Then the internal capacitor forms a voltage source of its own which is independent of the supply voltage. The periods of charging and switching to a double voltage are very brief, for example, of the order of 10 µsec, compared to the time necessary for the oscillator 12 to be set at a desired oscillation frequency (approximately 100 µsec.). The noise initially generated during the switching thus does not disturb the later operation of the synthesizer.

The known varactors have an extremely low control voltage of the order of several picoamperes, so that the discharging of the internal capacitor 100 is negligible.

The "own" voltage produced by the voltage doubler is applied to the varactor lines via a multiplexer 102. The role of the multiplexer is, in essence, to realize a distribution of the control voltage as a function of the logic codes produced by the logic table 50 visible in FIG. 3.

FIG. 5 shows an application of a frequency synthesizer according to the invention for the realization of a frequency converter and, more precisely, of a frequency converter in a signal transceiver.

The converter comprises a mixer to which is connected, on the one hand, a signal source to be converted, for example, an antenna 202 associated to a filter 204 and, on the other hand, a processing unit 206. The processing unit 206 receives the signal whose frequency is converted. This is, for example, a processing unit of a portable telephone.

The mixer 200 also receives a reference frequency signal of a second signal source which, in the described example, comes from an VCO oscillator 12 of a frequency synthesizer 1 in accordance with the invention.

Cited Documents (1) EP-B-0 661 816
(2) EP-A-0 563 400
(3) "Fractional-N Pll using delta-sigma modulation" by Thomas Stichelbout, Aalborg University, Aug. 5, 1997, pages 1 to 21.
(4) WO 89/06456
(5) EP-A-0 910 170
(6) EP-A-0 664 616
(7) EP-A-0 944 171
(8) U.S. Pat. No. 5,053,723
(9) U.S. Pat. No. 5,648,744

What is claimed is:

1. A frequency synthesizer comprising, in a phase-locked loop:
    a phase-frequency comparator,
    at least a voltage-controlled oscillator associated to selection means of an oscillation frequency band, and
    a frequency divider connected between the oscillator and the comparator,
and further comprising a voltage source proper connected to the selection means for supplying to the selection means a control voltage proper.

2. A frequency synthesizer as claimed in claim 1, in which the selection means comprise at least a varactor.

3. A frequency synthesizer as claimed in claim 2, in which the selection means comprise a multistage varactor and in which the voltage source proper comprises a multiplexer for distributing the control voltage proper to the stages of the varactor.

4. A frequency synthesizer as claimed in claim 1, in which the voltage source proper comprises a first electric capacitor and transition charging means of the first capacitor.

5. A frequency synthesizer as claimed in claim 4, in which the transition charging means comprise a voltage regulator associated with a second capacitor.

6. A frequency synthesizer as claimed in claim 5, in which the transition charging means comprise a non-regenerated voltage doubler.

7. A frequency synthesizer as claimed in claim 2, in which the frequency divider is a fractional divider having a dividing ratio with an adjustable integral part (N) and a fractional part (k), and in which the selection means of a stage of the varactor comprise a logic table connecting values of the integral part of the dividing ratio N to a selection of stages of the varactor.

8. The frequency synthesizer as claimed in claim 1 wherein the selection means is uncoupled from the output of the phase-frequency comparator and is operative to adjust the center frequencies of the oscillation frequency bands of the voltage controlled oscillator.

9. The frequency synthesizer as claimed in claim 1 wherein the selection means comprises a multistage varactor and the voltage source proper comprises a multiplexer for distributing the control voltage proper to the stages of the varactor.

10. The frequency synthesizer as claimed in claim 9 wherein the frequency divider is a fractional divider having a dividing ratio with an adjustable integral part (N), and
the selection means selects a stage of the varactor under the control of a logic table coupling values of the integral part of the dividing ratio (N) to the selection stages of the varactor.

11. The frequency synthesizer as claimed in claim 1, wherein the frequency divider is a fractional divider having a dividing ratio with an adjustable integral part (N) and a fractional part (k), and
further comprising control means for setting first and second control parameters in the frequency divider, the first control parameter being an adjustable integral part (N) of the dividing ratio and the second control parameter being a fractional part (k) of the dividing ration of the frequency divider.

12. A method of frequency synthesis by means of a frequency synthesizer as claimed in claim 1, comprising a transition phase for establishing the control voltage proper, followed by at least a frequency synthesis phase.

13. A method as claimed in claim 12, which comprises; starting the transition phase when the frequency synthesizer is switched on the first time and executed once until a next switch-on.

14. A frequency converter comprising a mixer having a first input connected to a first signal source delivering a signal having a frequency to be converted, a second signal source which has a reference frequency, means coupling the second source to a second input of the mixer, characterized in that the second signal source comprises a frequency synthesizer as claimed in claim 1.

15. A frequency synthesizer of the phase locked loop type comprising:
a voltage controlled oscillator having first and second voltage control inputs and an output coupled to an input of a frequency divider,
a phase-frequency comparator having a first input coupled to a source of reference voltage, a second input coupled to an output of the frequency divider, and an output coupled to the first voltage control input of the voltage controlled oscillator so as to control the frequency thereof,
selection means coupled to the second voltage control input of the voltage control led oscillator for the selection of oscillation frequency bands, and
a voltage source coupled to the selection means for supplying a separate control voltage thereto by means of which the selection means selects a particular oscillation frequency band for the voltage controlled oscillator.

16. The frequency synthesizer as claimed in claim 15, wherein the phase locked loop further comprises;
a loop filter coupled between the output of the phase-frequency comparator and the first voltage control input of the voltage controlled oscillator, and
the selection means comprise varactor means for varying the capacitance coupled to the second voltage control input of the voltage controlled oscillator.

17. The frequency synthesizer as claimed in claim 15, wherein
the selection means comprise a multistage varactor and the voltage source comprises a multiplexer for distributing the separate control voltage to the stages of the varactor.

18. The frequency synthesizer as claimed in claim 15, wherein the phase locked loop further comprises;
a sigma-delta modulator coupled to the frequency divider, and
the frequency divider is controlled by first and second control parameters, the first being an adjustable integral part (N) of the dividing ratio and the second being an adjusting instruction applied to the sigma-delta modulator to adjust a fractional part (K) of the dividing ratio of the frequency divider.

19. The frequency synthesizer as claimed in claim 18, wherein the phase lock loop further comprises;
a logic table coupled to the voltage source and controlled by the first control parameter which is the adjustable integral part (N) of the dividing ratio of the frequency divider.

* * * * *